*(12)* United States Patent
Zhang et al.

(10) Patent No.: US 10,367,666 B2
(45) Date of Patent: Jul. 30, 2019

(54) ADC BASED RECEIVER

(71) Applicant: Xilinx, Inc., San Jose, CA (US)

(72) Inventors: Hongtao Zhang, San Jose, CA (US);
Yohan Frans, Palo Alto, CA (US);
Geoffrey Zhang, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/471,364

(22) Filed: Mar. 28, 2017

(65) Prior Publication Data

US 2018/0287837 A1    Oct. 4, 2018

(51) Int. Cl.
*H04B 1/06* (2006.01)
*H04L 27/01* (2006.01)
*H03M 1/18* (2006.01)
*H04L 25/06* (2006.01)
*H03M 1/36* (2006.01)

(52) U.S. Cl.
CPC ............ *H04L 27/01* (2013.01); *H03M 1/182* (2013.01); *H04B 1/06* (2013.01); *H04L 25/063* (2013.01); *H03M 1/361* (2013.01); *H04B 2203/5425* (2013.01); *H04Q 2213/03* (2013.01)

(58) Field of Classification Search
CPC ... H04L 27/01; H04B 1/06; H04B 2203/5425; H04Q 2213/03
See application file for complete search history.

(56) References Cited

U.S. PATENT DOCUMENTS

| | | | |
|---|---|---|---|
| 2006/0274861 A1* | 12/2006 | Langenbach | ..... H04L 25/03197 375/341 |
| 2010/0086090 A1* | 4/2010 | Lin | ......... G11B 20/14 375/354 |
| 2011/0115660 A1 | 5/2011 | Singer | |
| 2014/0072024 A1* | 3/2014 | Warke | ................. H04L 27/0014 375/232 |
| 2016/0352557 A1 | 12/2016 | Chang et al. | |

* cited by examiner

*Primary Examiner* — Janice N Tieu
(74) *Attorney, Agent, or Firm* — Gerald Chan; Robert M. Brush

(57) ABSTRACT

A receiver includes: an automatic gain controller (AGC) configured to receive an analog signal; an analog-to-digital converter (ADC) configured to receive an output from the AGC and to output a digitized signal, wherein a most significant bit of the digitized signal corresponds to a sliced data, and a least significant bit of the digitized signal corresponds to an error signal; and an adaptation unit configured to control the AGC, the ADC, or both the AGC and the ADC, based at least in part on the digitized signal to achieve a desired data digitization and data slicing.

18 Claims, 7 Drawing Sheets

| ADC Output | Recovered Data | Error Signal |
|---|---|---|
| 111 | 3 | 1 |
| 110 | 3 | 0 |
| 101 | 1 | 1 |
| 100 | 1 | 0 |
| 011 | -1 | 1 |
| 010 | -1 | 0 |
| 001 | -3 | 1 |
| 000 | -3 | 0 |

FIG. 4

| Recovered Data | Error Signal | AGC Vote |
|---|---|---|
| 3 | 1 | Dec |
| 1 | -1 | Inc |
| -3 | -1 | Dec |
| -1 | 1 | Inc |

501

| Recovered Previous Data | Error Signal | CTLE Vote |
|---|---|---|
| 3 | 1 | Inc |
| 1 | 1 | Inc |
| -3 | -1 | Inc |
| -1 | -1 | Inc |
| 3 | -1 | Dec |
| 1 | -1 | Dec |
| -3 | 1 | Dec |
| -1 | 1 | Dec |

ADC BASED RECEIVER

TECHNICAL FIELD

The present disclosure relates to integrated circuit devices (ICs). More particularly, the following description relates to a receiver architecture for low loss links.

BACKGROUND

High speed digital ICs are used in Serializer/Deserializer (SerDes) systems. Today's high-speed SerDes systems require use of equalizers to ensure signal integrity in the system. In these systems, a lossy channel exists between a transmitter circuit and the receiver circuit, and at high data rates, the received data stream is severely distorted and requires reconstruction (e.g., equalization) before use. During transmission of bit streams into and out of a channel, rapidly alternating zeros and ones of the signal do not reach their full steady state values at the receiver due a lossy characteristic of the channel. This causes an output data stream that is much more distorted than the input data. As a result, the data needs to be reconstructed or equalized for the received data to become usable.

Analog-to-Digital Converters (ADC)-based high speed serial link receivers offer an opportunity for applying advanced signal equalization techniques via digital signal processing (DSP) and, therefore, enable reliable communications at high data rates via lossy channels. Pulse-amplitude-modulation with four amplitude levels ("PAM-4") signal schemes are suitable for data rate beyond 56 Gbps as most backplane channels have excessive loss at 28 GHz. A PAM-4 signal is a form of signal modulation where the message information is encoded in the amplitude of a series of signal pulses. In some cases, ADC-based PAM4 receivers may be well suited for 50+ Gbps serial data communication for various systems, from short reach (e.g., die-to-die) application to long reach application (e.g., through backplanes).

In some cases, to reduce quantization noise and to improve serial link bit-error rate (BER), baud-rate ADC requires a certain resolution (number of bits). Currently, all available SerDes ADCs use a fixed resolution (fixed number of bits). For example, a 6-bit to 8-bit resolution may be used to handle long reach channels.

In certain application, the resolution of an ADC may be made higher. However, higher resolution of ADC comes with a heavy power efficiency penalty in that the ADC itself as well as its DSP will need to consume significantly more power. This may not be justified when the receiver is used in the short reach or medium reach applications when the finite impulse response and analog equalizer therein alone are sufficient to recover the data eye.

SUMMARY

A receiver includes: an automatic gain controller (AGC) configured to receive an analog signal; an analog-to-digital converter (ADC) configured to receive an output from the AGC and to output a digitized signal, wherein a most significant bit of the digitized signal corresponds to a sliced data, and a least significant bit of the digitized signal corresponds to an error signal; and an adaptation unit configured to control the AGC, the ADC, or both the AGC and the ADC, based at least in part on the digitized signal to achieve a desired data digitization and data slicing.

Optionally, the ADC is configured to perform an analog-to-digital conversion function and a slicer function.

Optionally, the digitized signal comprises information corresponding to a mapping function.

Optionally, an operation between the ADC and the adaptation unit does not require a digital signal processor (DSP).

Optionally, the ADC comprises an adaptation logic table.

Optionally, the receiver further includes a digital signal processor (DSP) coupled to the ADC 106, wherein the DSP is configured to be switched on when the receiver is performing processing for long reach application, and is configured to be switched off when the receiver is performing processing for short reach application.

Optionally, the adaptation unit comprises a AGC adaptation table configured to provide values for determining an AGC control signal to control the AGC.

Optionally, the receiver further includes a continuous time linear equalizer (CTLE) configured to provide the analog signal, wherein the adaptation unit comprises a CTLE adaptation table configured to provide values for determining a CTLE control signal to control the CTLE.

Optionally, the adaptation unit is configured to provide a Vref signal for controlling the ADC; wherein the adaptation unit is configured to reduce the Vref signal if a recovered data associated with a AGC code is at a maximum value and an AGC vote is increasing; and wherein the adaptation unit is configured to increase the Vref signal if the recovered data associated with the AGC code is at a minimum value and the AGC vote is decreasing.

Optionally, the receiver further includes a continuous time linear equalizer (CTLE) configured to provide the analog signal, wherein the adaptation unit is configured to adjust a parameter of the CTLE based at least in part on the error signal.

Optionally, the adaptation unit is configured for adjusting a parameter of the AGC based at least in part on the error signal.

Optionally, the input signal is a PAM-N signal, the ADC comprises a X-bit ADC, and wherein X is equal to log 2(2*N).

Optionally, the input signal is a PAM-2 signal or a PAM-4 signal.

Optionally, the receiver is a part of, or is configured to operate with, a short-reach system.

Optionally, the receiver further includes a continuous time linear equalizer (CTLE) configured to provide the analog signal.

A method performed by a receiver includes: providing an output by an automatic gain controller (AGC) based on an analog signal; providing a digitized signal by an analog-to-digital converter (ADC) based on the output from the AGC, wherein a most significant bit of the digitized signal corresponds to a sliced data and a least significant bit of the digitized signal corresponds to an error signal; and controlling the AGC, the ADC, or both the AGC and the ADC, based at least in part on the digitized signal to achieve a desired data digitization and data slicing, wherein the act of controlling is performed by an adaptation unit.

Optionally, the method further includes performing a slicer function by the ADC

Optionally, the method further includes providing a Vref signal by the adaptation unit for controlling the ADC; wherein the act of providing the Vref signal comprises reducing the Vref signal if a recovered data associated with a AGC code is at a maximum value and an AGC vote is increasing, or increasing the Vref signal if the recovered data associated with the AGC code is at a minimum value and the AGC vote is decreasing.

Optionally, the analog signal is provided by a continuous time linear equalizer (CTLE), and wherein the method further comprises: using an AGC adaptation table to determine an AGC control signal to control the AGC; and/or using a CTLE adaptation table to determine a CTLE control signal to control the CTLE.

Optionally, the digitized signal comprises information corresponding to a mapping function.

Other features, advantageous, and/or embodiments will be described in the detailed description.

BRIEF DESCRIPTION OF THE DRAWINGS

FIG. 4 illustrates an example of a mapping table that maps ADC codes to recovered data and error signals.

FIG. 5 illustrates an example of an AGC adaptation table and an example of a CTLE adaptation table.

DETAILED DESCRIPTION

Various examples are described hereinafter with reference to the figures. It should be noted that the figures are only intended to facilitate the description of the exemplary structures and methods. They are not intended as an exhaustive description of the claimed invention, or as a limitation on the scope of the claimed invention. In addition, an illustrated example needs not have all the aspects or advantages shown. An aspect or an advantage described in conjunction with a particular example is not necessarily limited to that example, and can be practiced in any other examples even if not so illustrated, or if not so explicitly described.

A new receiver is described herein. The receiver allows for ADC-based SerDes receiver to cut down power significantly while allowing for short reach to medium reach applications. In contrast, analog-based SerDes receiver would still need 16-28 high speed slicers regardless of the channel loss and, therefore, its power cannot be dramatically scaled down for short reach applications or medium reach applications.

In one embodiment described herein, the receiver uses a lower resolution analog-to-digital converter (ADC) without a digital signal processor to significantly improve the receiver's power efficiency. Also, in the receiver described herein, the analog-to-digital function is merged directly with data recovery and error signal generation in the ADC. Such may be employed for PAM-4 signaling so that the number of bits output by the ADC can be reduced to 3. This obviates the need to use a digital signal processor (DSP) in the receiver to achieve a desired data equalization and data slicing. In addition, the receiver describe herein allows adaptation of equalization loops for continuous time linear equalization and automatic gain control. The algorithms of the equalization loops determine how much analog gain and analog equalization to adjust in the next round before the ADC processes the samples again. This process is performed without using a DSP, resulting in saving a tremendous amount of power compared to systems that use DSPs in receivers.

In accordance with some embodiments, the ADC is a decision-making ADC in the sense that it combines the analog-to-digital conversion function with a slicer function.

The receiver described herein may be applied to many applications, such as communication from die to die, communication from optical link, or optical conversion, because the loss is very small in these situations. Furthermore, the receiver may be applied to support different types of protocols based on how many bits are needed at the ADC. In some cases, the receiver described herein may be configured to support PAM-4 signaling so that a number of bits needed for operation of the ADC can be reduced to 3. In other embodiments, the receiver may support any PAM-M signaling systems, including the case of M=2 (which is the Non-return-to-zero (NRZ) signaling system).

Figure 1:
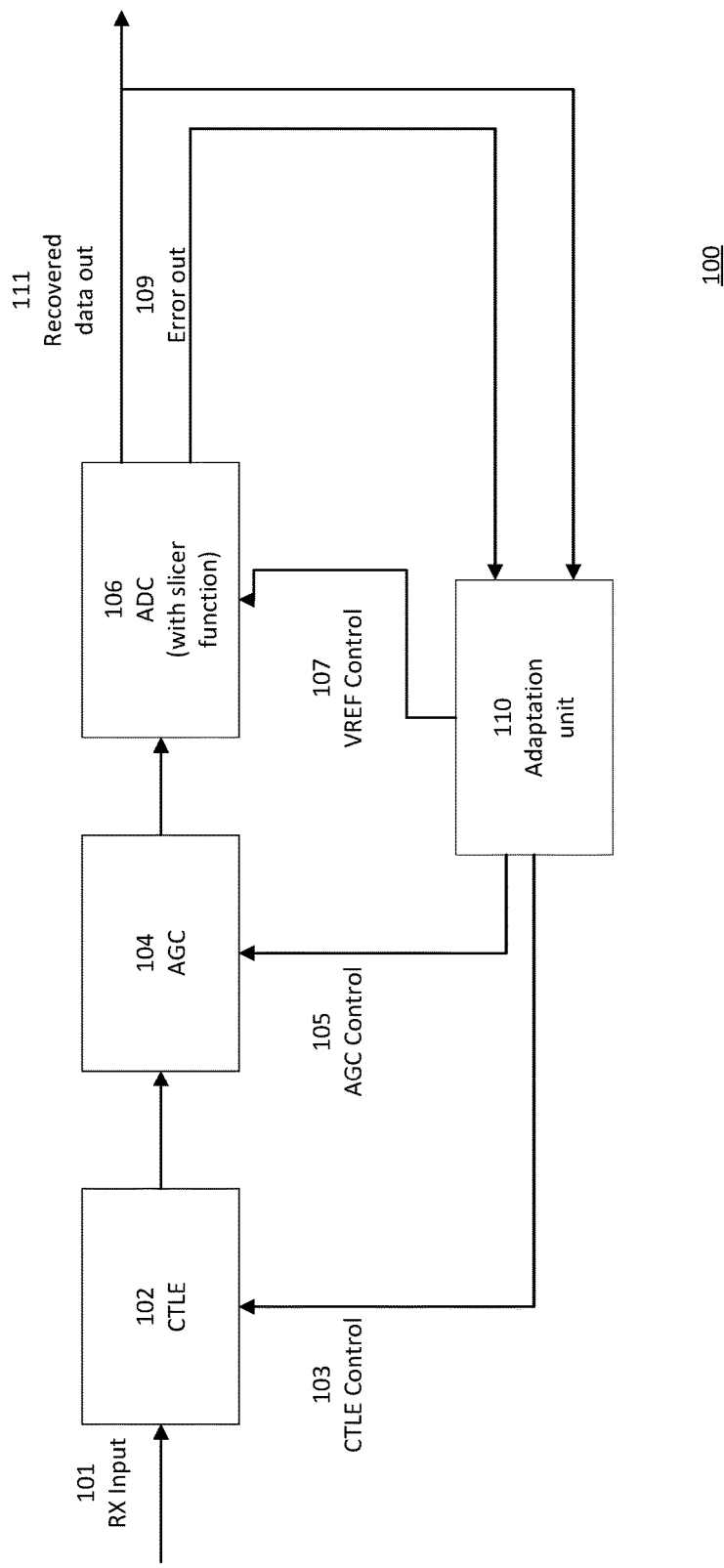
FIG. 1 illustrates a receiver that does not require a digital signal processor.

FIG. 1 illustrates a receiver 100. The receiver 100 includes a continuous time line equalizer ("CTLE") 102, an analog gain control ("AGC") 104, and an analog-to-digital converter ("ADC") 106. The receiver 100 may be implemented in an FPGA, an ASIC, or any other integrated circuits used for data communication at a high serial data rate, such as data rate above 10 gigabits/second ("Gbit/s"), and more preferably above 30 Gbit/s, and even more preferably above 50 Gbit/s. The receiver 100 may be used as a part of a SerDes, where serial data output by receiver 100 is subsequently converted to parallel data. For purposes of clarity, the following description focuses on recovery of a serial data stream output by a receiver 100, and so known details regarding conversion of such serial data to parallel data are not described.

The CTLE 102 is configured to pre-filter or pre-equalize an input signal 101 to provide an analog signal. In some cases, the CTLE 102 is configured to equalize the combined characteristics of the transmitter and channel, and to remove the intersymbol interference (ISI) at the received signal sampling points. Also, in some embodiments, the CTLE 102 may be a linear filter configured to attenuate low-frequency signal components, amplify components around the Nyquist frequency, and filter off higher frequencies. CTLE gain can be adjusted to optimize the ratio of low frequency attenuation to high frequency amplification.

The AGC 104 is configured to amplify the analog signal from the CTLE 102 to provide an amplified signal. In the illustrated embodiments, the AGC 104 is configured to vary a gain automatically without any user manipulation, thereby controlling a magnitude of the signal. The AGC 104 is used to fit a signal amplitude to an ADC's dynamic range. In some embodiments, the AGC may initially establish an analog gain signal to a maximum gain value at "wake up" (e.g., initiation of gain control) to reach a desired sensitivity level. If the analog gain is not at a maximum level when the ADC 106 is trying to detect the presence of a signal, it is possible that some of the received signals may be missed because the signals may be a short burst of data. Therefore, it is important to wake up at maximum gain, as opposed to initiating the gain control from a medium level of gain. An AGC algorithm may rely upon the power levels of the signal of interest and the signal-to-noise ratio of this signal.

The ADC 106 is configured for converting the analog signal from the AGC 104 to digital samples. In the illustrated embodiment, the ADC 106 is configured to convert the analog (continuously variable) signal into digital (multilevel) signals without altering their essential content. In some cases, the analog information is transmitted by modulating a continuous transmission signal and by amplifying the strength of the signal in order to add or subtract data. The inputs to the ADC 106 may include a voltage that can vary among a theoretically infinite number of values. However, the output of the ADC 106 has defined levels or states. The simplest digitized signal has only two states (e.g., binary). Digitized signals are transmitted in a more efficient way than analog signals because well-defined digital impulses are easier for a circuit to distinguish than noise.

In the illustrated embodiments, the ADC 106 is configured to provide a digitized signal having information on recovered data 111 and error signal 109. Although the recovered data 111 and the error signal 109 are illustrated as two outputs in the figure, in some embodiments, the recovered data 111 and the error signal 109 may be combined into a single output. Also, in the illustrated embodiments, the digitized signal from the ADC 106 may be an ADC code generated based on a signal generation scheme in which the recovered data and the error signal are combined to form parts of the ADC code. For example, the ADC code in the digitized signal output by the ADC 106 may include multiple bits, wherein one or more bits in the ADC code are associated with the recovered data, and one or more other bits in the ADC code are associated with the error signal.

The adaptation unit 110 is coupled to the CTLE 102, the AGC 104, and the ADC 106. The adaptation unit 110 is configured to provide a CTLE control signal 103 to control the CTLE 102, an AGC control signal 105 to control the AGC 104, a voltage reference Vref control signal 107 to control the ADC 106, or a combination of two or more of the foregoing, based on the digitized signal from the ADC 106. In some embodiments, the adaptation unit 110 is configured to provide Vref control signal to control the ADC 106 when the signal being processed is out of range. Because the digitized signal includes ADC code that combines or represents recovered data and error signal, the adaptation unit 110 is configured to determine the recovered data and error signal based on a mapping scheme (e.g., mapping table), and use the recovered data and error signal to determine the CTLE control signal 103 and/or the AGC control signal 105 for controlling the CTLE 102 and/or the AGC 104, respectively.

In the above embodiments, the receiver 100 is described as having a 3-bit ADC architecture. In other embodiments, the ADC in the receiver 100 may have other numbers of bit architecture. For example, in other embodiments, a 2-bit ADC architecture may be used.

In some embodiments, the receiver 100 may optionally further include an analog equalizer for providing an analog equalization function. In some cases, the analog equalizer may be configured to provide such analog equalization adaptively.

Figure 2:
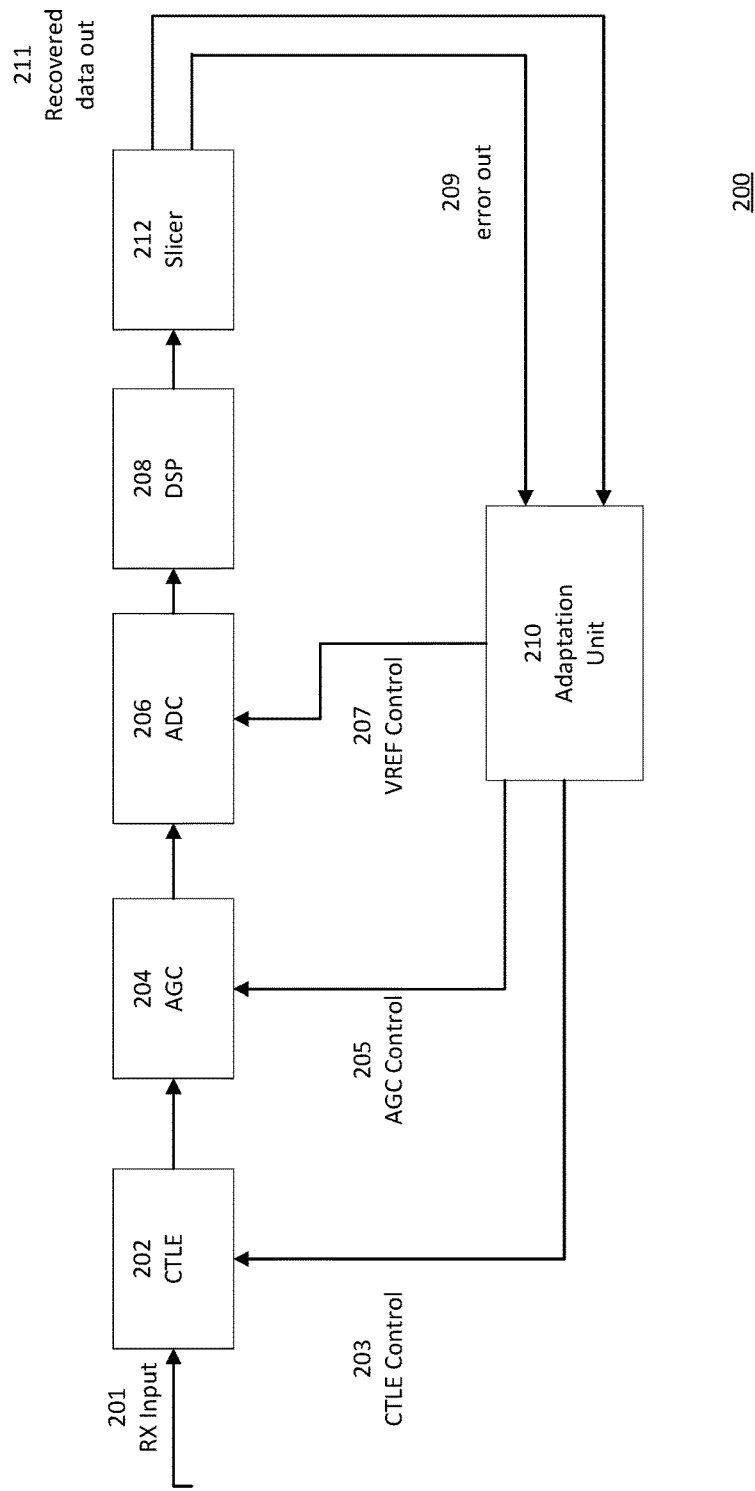
FIG. 2 illustrates another receiver that requires a digital signal processor.

FIG. 2 illustrates another receiver 200. The receiver 200 includes a continuous time line equalizer ("CTLE") 202, an analog gain control ("AGC") 204, an analog-to-digital converter ("ADC") 206, and an adaptation unit 210. The configuration of the receiver 200 is similar to the receiver 100 of FIG. 1, except that the receiver 200 further includes a digital signal processor ("DSP") 208. The DSP 208 includes a feed-forward equalization ("FFE") block and a decision feedback equalization ("DFE"). The DSP 208 is coupled to a slicer 212. The DSP 208 and the slicer 212 are configured to process digital samples to perform equalization, in order to achieve a desired data digitization and data slicing. In particular, during use of the receiver 200, the FFE is used for equalizing the digital samples to provide equalized samples. Then, the DFE is used for receiving the equalized samples for providing re-equalized samples. This equalization being performed at the DSP 208 takes a huge amount of processing power. The FFE may be configured for removing interference from both the pre-cursor ISI and post-cursor ISI. The FFE modifies the amplitudes of symbols surrounding transitions while keeping the transmitted power constant. After the FFE processes the samples, the slicer 212 then slices the re-equalized samples. In some cases, the DFE in the DSP 208 is configured to feed a sum of logic or symbol decisions back to the slicer 212. As shown in the figure, the slicer 212 produces both an error signal 209 and recovered data 211, for input to the adaptation unit 210. The adaptation unit 210 provides a CTLE control signal 203 for controlling the CTLE 202, an AGC control signal 205 for controlling the AGC 204, and a VREF control signal 207 for controlling the ADC 206. The above-described equalization process performed at the DSP 208 takes a huge amount of processing power.

Thus, in comparing the receiver 200 with the receiver 100 of FIG. 1, it can be seen that the receiver 100 is advantageous over the receiver 200. This is because the receiver 100 does not require any DSP to achieve a desired data equalization and data slicing. Rather, in the configuration of the receiver 100 shown in FIG. 1, the analog-to-digital function is merged directly with data recovery and error signal generation in the ADC 106. In some embodiments, the ADC 106 is configured to provide its output directly to the adaptation unit 110. In other embodiments, the ADC 106 is configured to provide its output indirectly to the adaptation unit 110 through an intermediary component that is not a DSP.

The receiver 100 is also advantageous because it may reduce processing complexity and level of interaction among its components, thereby increasing robustness of receiver 100. Also, the receiver 100 may support high-speed data rates, such as 40 Gbits/s or more. Accordingly, the receiver 100 may be used for high-speed serial links, including in more challenging SerDes channel applications than conventional analog-based receivers.

In addition, the receiver 100 is advantageous because it has applications for both long channels (e.g., 20-30 dB+ channels) and short channels. High-speed digitization and high-speed equalization consume a lot of power. There is a balance and tradeoff between how much equalization to use and how many bits of ADC is needed in the receiver 100. For high loss channels, more ADC bits may be desired to reduce the quantization noise because every instance of quantization will create noise. For short-reach application (short channels), the system may use less bits which results in power saving for the ADC 106. Also, in short-reach application, there is a lot less interference involved than the long reach applications. This results in less data processing so the receiver 100 can identify what the bit is based on techniques described herein without using any DSP. For long reach application, the ADC 106 can be reconfigured back to a high resolution ADC. In some embodiments, the receiver 100 may optionally further include a DSP coupled to the ADC 106, wherein the DSP may be switched on or off. The DSP may be switched on when the receiver 100 is performing processing for long reach application, and switched off when the receiver 100 is performing processing for short reach application. Therefore, the flexible architecture configuration could support long reach application while reducing power significantly for short reach application.

It should be noted that a "reach" of a channel is tied to certain channel (transmission media) loss, and may imply the length of the transmission media, such as backplane, PCB trace, copper cable, etc. In some cases, as used in this specification, the term "long" reach, or any of similar terms (e.g., "long" application) may refer to a channel that has a channel loss, such as an insertion channel loss, of more than 20 dB. Also, as used in this specification, the term "short" reach, or any of similar terms (e.g., "short" application) may refer to a channel that has a loss, such as an insertion channel loss, that is less than that for "long" reach/application, such as less than 15 dB. A channel "loss" (in dB) is a function of frequency because the loss amount is different at different frequencies. In some embodiments, a channel "loss" may refer to the loss at Nyquist frequency, which may be calculated as f Nyquist (in Hz)=DR/(2*log 2(N)) for a PAM-N signal, wherein DR is data rate (in bits/second). In other cases, regardless of the amount of channel loss, a "long" reach or any of similar terms may refer to a channel that is associated with two connectors, e.g., such as those for backplane, midplane, or cable applications. Similarly, in other cases, regardless of the amount of channel loss, a "short" reach or any of similar terms may refer to a channel that is associated with no connectors (e.g., channel for chip-to-chip) or one connector (chip-to-module).

Also, in order to reduce quantization noise and improve serial link bit-error rate (BER), ADC may require a certain resolution (e.g., number of bits). For example, an ADC may use a 6-bit to 8-bit resolution to handle long reach channels. However, the higher resolution of ADC suffers from a heavy power efficiency in both the ADC itself as well as in DSP. This heavy power consumption is not justified when the receiver is used in the short-reach to medium-reach systems when the FIR and analog equalizer alone are sufficient to recover the data eye. The receiver 100 describe herein is advantageous because it uses a lowest resolution for the ADC 106 with low bit architecture, and does not requires use of a DSP.

Also, in one or more embodiments, the ADC 106 in the receiver 100 may be a programmable ADC 106. In such cases, the ADC 106 may be programmed to achieve further power reduction.

Figure 3:
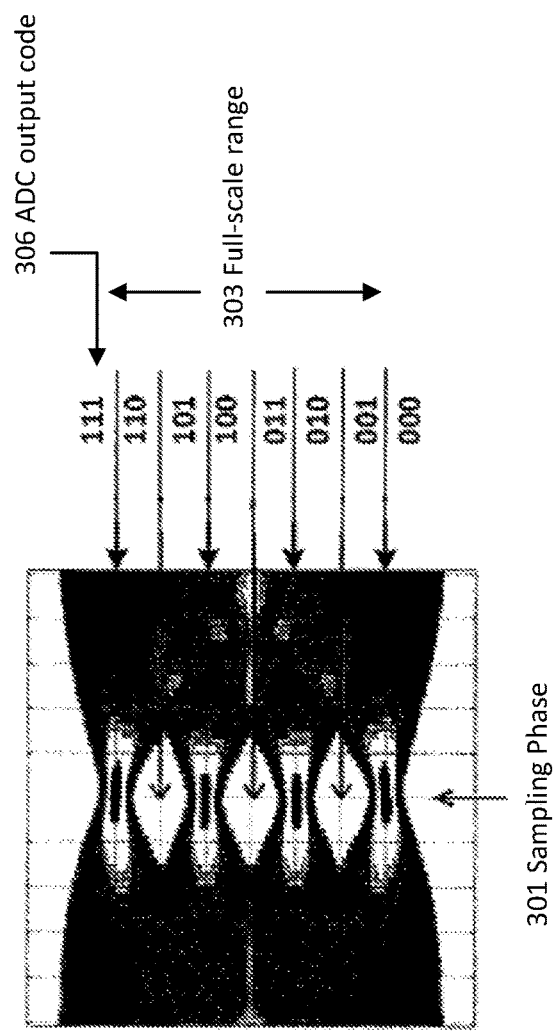
FIG. 3 illustrates an example of an analog-to-digital converter's full-scale range and ADC output codes for various input amplitudes.

As discussed, the ADC 106 is configured to provide a digitized signal having information on recovered data 111 and error signal 109. In some embodiments, the digitized signal output from the ADC 106 includes ADC codes with bit values that represent recovered data and error signal. FIG. 3 illustrates a ADC full-scale range 303 of various input amplitudes, and the corresponding ADC codes 306 for the various input amplitudes through the range 303. In the illustrated example, ADC codes 306 are for a PAM-4 input signal that is associated with a 3-bit ADC architecture, where every 2 bits of data is coded to one symbol. In other embodiments, the ADC codes 306 may be for other types of input signals (e.g., PAM-M input signal, where M may be any integer).

In FIG. 3, the sampling phase 301 shows three "eyes" or openings, and four levels of signals in the range 303. If the receiver 100 receives a signal in the first top level, the corresponding ADC code 306 is "111". On the other hand, if the receiver 100 receives a signal in the second level, then the ADC code 306 is "110". Similar concept applies for the rest of the ADC codes 306 across the remaining parts of the range 303. As shown in the example, each ADC code has a number of bits. The first two bits in each ADC code contain information regarding the recovered data, and the third bit in each ADC code contains information regarding the error signal. In this example, the two most significant bits (e.g., the first and second bits) in the ADC code 306 correspond to the recovered data information. For instance, for the ADC code 306 of "111" and "110", when the ADC 106 resolves these two ADC codes 306, the receiver 100 takes the two most significant bits (e.g., "1" and "1" at the first two bit locations). In another example, for the two ADC codes 306 of "001" and "000" (the two bottom most levels in the range 303), the ADC 106 can them by taking the two most significant bits (e.g., "0" and "0" at the first two bit locations). Also, in each ADC code 106, the third bit is the least significant bit that indicates the signal relative length to a reference. Thus, the third bit in the ADC 106 may represent an error signal.

It should be noted that as used in this specification, the term "most significant bit" refers to any bit or value representing or associating with at least a part of a data being recovered, and is not necessarily limited to any bit or value having any particular level of importance or significance. Similarly, the term "least significant bit" refers to any bit or value representing or associating with at least a part of an error signal, and is not necessarily limited to any bit or value having any particular level of importance or significance.

It should be noted that, the ADC's 106 full scale range works the best when the full-scale range merges with signal amplitude. If an ADC full scale range is larger than the signal amplitude, then the resulting data would not match, and clipping of signal data may happen. In some embodiments, the AGC 104 and the ADC 106 may be controlled such that the ADC full-scale range 303 covers an entire eye.

In some embodiments, the receiver 100 can use the exact ADC bit number to directly recover data without wasting the number of bits, based on how many levels are in the sampling phase. As shown in FIG. 3, PAM-4 signal has four levels of signaling, so a 3-bit ADC is used. In some embodiments, the lowest ADC resolution can be used for the ADC 106.

In other embodiments, other types of signals may have other levels of signaling, and other numbers of bit architecture for the ADC 106 may be used. The number X of ADC bits that may be used for a PAM-N signaling may be calculated based on the equation: X=log 2(2*N), where N is the PAM-N. For example, for PAM-2 (non-return-to-zero or "NRZ"), the number X of ADC bits for the ADC 106 may be calculated as log 2(2*2), which is 2. As such, PAM-2 signal involves a 2-bit protocol, and a 2-bit ADC may be used for the ADC 106. In another example, for PAM-4, the number X of ADC bits is log 2(2*4), which is equal to 3.

FIG. 4 illustrates a mapping table 400 which maps ADC codes (digital output of ADC) to recovered data and errors signals. As used in this specification, the term "recovered data" may refer to any data output from the ADC 106 or any data derived from output of the ADC 106. Thus, the term "recovered data" should not be limited to data that is fully "recovered" and may refer to data that is partly recovered, or being recovered in a process. Referring to FIG. 4, the first column in the mapping table 400 includes various values of ADC codes. For each ADC code in the first column, there is a corresponding recovered data value (shown in the middle column in the mapping table 400), and an error signal (shown in the last column in the mapping table 400). Accordingly, when the ADC 106 in the receiver 100 provides its digital output having any of the values shown in the first column in the mapping table 400, there is a corresponding recovered data and a corresponding error signal as shown in the mapping table 400. As discussed previously with reference to FIG. 1, the output of the ADC 106 is sent to the adaptation unit 110. The adaptation unit 110 provides the CTLE control signal 103 to control the CTLE 102, the AGC control signal 105 to control the AGC 104, the Vref control signal 107 to control the ADC 106, or any combination of two or two of the foregoing, based on the output (e.g., the ADC codes) of the ADC 106. In some cases, the recovered data is also sent to a physical coding sublayer for further processing. The mapping table 400 in the illustrated example corresponds to a PAM-4 signaling scheme. In other embodiments, the mapping table 400 may be configured to correspond with other signaling schemes.

As discussed, each ADC code has a corresponding recovered data value and an error signal value. Thus, in some embodiments, the ADC code can be used to represent or determine (e.g., derive) both a recovered data and the error signal based on the mapping table 400. As shown in first two rows in the mapping table 400 of FIG. 4, if the digital output of the ADC 106 has the ADC code of "111" or "110", the corresponding recovered data value will be "3" based on the two most significant bits ("1" and "1" in the first two digits) in each of the ADC codes "111", "110". The least significant bit of the ADC code is the last digit in the illustrated example. A bit of "1" has a corresponding error signal value of "1", and a bit of "0" has a corresponding error signal value of "0".

As shown in third and fourth rows in the mapping table 400 of FIG. 4, if the digital output of the ADC 106 has the ADC code of "101" or "100", the corresponding recovered data value will be "1" based on the two most significant bits ("1" and "0" in the first two digits) in each of the ADC codes "101", "100". Again, the least significant bit of the ADC code is the last digit in the illustrated example. A bit of "1" has a corresponding error signal value of "1", and a bit of "0" has a corresponding error signal value of "0".

As shown in fifth and sixth rows in the mapping table 400 of FIG. 4, if the digital output of the ADC 106 has the ADC code of "011" or "010", the corresponding recovered data value will be "−1" based on the two most significant bits ("0" and "1" in the first two digits) in each of the ADC codes "011", "010". Again, the least significant bit of the ADC code is the last digit in the illustrated example. A bit of "1" has a corresponding error signal value of "1", and a bit of "0" has a corresponding error signal value of "0".

As shown in seventh and eighth rows in the mapping table 400 of FIG. 4, if the digital output of the ADC 106 has the ADC code of "001" or "000", the corresponding recovered data value will be "−3" based on the two most significant bits ("0" and "0" in the first two digits) in each of the ADC codes "001", "000". Again, the least significant bit of the ADC code is the last digit in the illustrated example. A bit of "1" has a corresponding error signal value of "1", and a bit of "0" has a corresponding error signal value of "0".

In the above example, four numerical values 3, 1, −1, 3 are used to represent recovered data. In other embodiments, other set of numerical values (e.g., 0, 1, 2, 3) may be used to represent the recovered data. In further embodiments, non-numerical values (which may be converted into numerical values) may be used to represent recovered data.

In some embodiments, the mapping table 400 may be implemented at the adaptation unit 110 for allowing the adaptation unit 110 to determine the recovered data and the error signal based on the ADC code. In particular, the adaptation unit 110 is configured to receive the digitized signal from the ADC 106, and determine the recovered data and the error signal using the mapping table 400 based on the ADC code in the digitized signal.

As discussed, the adaptation unit 110 is also configured to control the CTLE 102, the AGC 104, the ADC 106, or two or more of any of the foregoing. In some embodiments, the controlling of these components by the adaptation unit 110 may be performed based on the recovered data and the error signal determined based on the corresponding ADC code in the digitized signal.

FIG. 5 illustrates an AGC adaptation table 501, and a CTLE adaptation table 503. The AGC adaptation table 501 is configured to link a value of the AGC control signal 105 (for controlling the AGC 104) to a corresponding recovered data and error signal. For example, as shown in the first row of the AGC adaptation table 501, if the recovered data has a value of "3" and the error signal has a value of "1", then the AGC vote will have a value "Dec" or another value to prescribe a decrease of the control signal 105. Accordingly, the AGC vote is a voting decision to increase or decrease the AGC code. The CTLE adaptation table 503 is configured to link a value of the CTLE control signal 103 (for controlling the CTLE 102) to a corresponding recovered data and error signal. For example, as shown in the first row of the CTLE adaptation table 503, if the recovered data has a value of "3" and the error signal has a value of "1", then the CTLE vote will have a value "Inc" or another value to prescribe an increase of the CTLE control signal 103.

In some embodiments, the AGC adaptation table 501 and the CTLE adaptation table 503 may be implemented in the adaptation unit 110. During use, the adaptation unit 110 uses the CTLE adaptation table to generate a CTLE control signal for controlling the CTLE 102. Also, the adaptation unit 110 uses the AGC adaptation table 501 to generate an AGC control signal 105 for controlling the AGC 104.

The above example of the AGC adaptation table 501 and the CTLE adaptation table 503 correspond with the PAM-4 signal scheme described in the example. In other embodiments, the AGC adaptation table 501 and the CTLE adaptation table 503 may be configured for other signaling schemes.

In some embodiments, the adaptation unit 110 is configured to use both of the adaptation tables 501, 503 together to control the CTLE 102 and the AGC 104, so that the receiver 101 can adapt to control how much gain (as controlled by the AGC control signal 105) is needed and how much analog equalization (as controlled by the CTLE control signal 103) is needed. Accordingly, based on the recovered data and error signal output from the ADC 106, the receiver 100 can adjust the parameters of the CTLE 102 and the AGC 104 (via the CTLE control signal 103 and the AGC control signal 105 output from the adaptation unit 110) to work optimally the next time around. Thus, the recovered data and error signal determined based on the table 400 in FIG. 4 can also be subsequently used for controlling the CTLE 102 and the AGC 104. In some embodiments, the recovered data and error signal may also be used to control Conventional baud rate (CDR).

Figure 6:
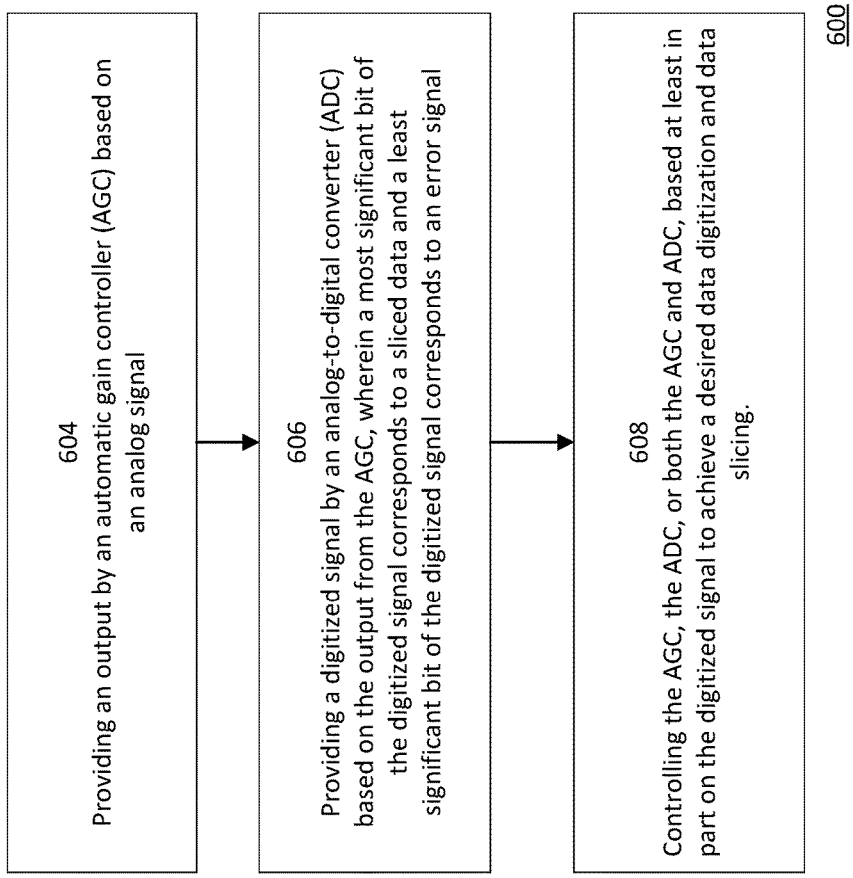
FIG. 6 illustrates a method performed by the receiver of FIG. 1.

FIG. 6 illustrates a method 600 performed by the receiver 100. First, an output is provided by an automatic gain controller (AGC) based on an analog signal (item 604). In some embodiments, when performing item 604, the AGC amplifies the output to provide an amplified signal. In some cases, the analog signal may be provided by a continuous time linear equalizer (CTLE) based on an input signal. In such cases, the method 600 may optionally further include providing the analog signal by the CTLE based on the input signal. The input signal may be a PAM-4 signal in some embodiments. In other embodiments, the input signal may be other PAM-M signal. In the case in which M=2, the input signal may be a NRZ signal. Also, in some embodiments, the CTLE may pre-filter or pre-equalize the input signal to provide the analog signal for reception by an AGC.

Next, a digitized signal is provided by an analog-to-digital converter (ADC) based on the output from the AGC, wherein a most significant bit of the digitized signal corresponds to a sliced data and a least significant bit of the digitized signal corresponds to an error signal (item 606). In some embodiments, the ADC performing item 606 may be a 3-bit ADC. In other embodiments, the ADC performing item 606 may have other numbers of bit architecture. Also, in some embodiments, the digitized signal from the ADC may be a differential pair of signals (e.g., recovered data and data error). In one implementation, when performing item 606, the ADC receives an amplified analog signal and converts it to digital samples by serializing the data. The digitized signal is then created by combining the digital samples with error signal. For example, a mapping table that maps ADC codes with recovered data and error signal may be used to generate the ADC codes that are output as digitized signal from the ADC.

Next, an adaptation unit controls the AGC, the ADC, or both the AGC and the ADC, based at least in part on the digitized signal to achieve a desired data digitization and data slicing (item 608). In some embodiments, the adaptation unit receives the digitized signal directly from the ADC. In other embodiments, the adaptation unit receives the digitized signal indirectly from the ADC through an intermediary component that is not a DSP.

In some embodiments, in the method 600, an operation between the ADC and the adaptation unit does not require a DSP.

Also, in some embodiments, the method 600 may further include providing a Vref signal by the adaptation unit for controlling the ADC. In one implementation, the act of providing the Vref signal includes reducing the Vref signal if a recovered data associated with an AGC code is at a maximum value and an AGC vote is increasing, or increasing the Vref signal if the recovered data associated with the AGC code is at a minimum value and the AGC vote is decreasing. This allows the signal to be adjusted appropriately before the ADC processes the signal again in the next round.

Also, in some embodiments, the adaptation unit performing item 608 may comprise a AGC adaptation table and/or a CTLE adaptation table. The AGC adaptation table is configured to provide values based on recovered data and error signal to configure an AGC control signal for controlling the AGC. Similarly, the CTLE adaptation table is configured to provide values based on recovered data and error signal to configure a CTLE.

In one or more embodiments descried herein, soft logic and/or field-programmable gate array (FPGA) elements may be used to build or implement any portion of the receiver 100. In other embodiments, any or the entire portion of the receiver 100 may be implemented via an FPGA, or any of other types of processor.

Where the method 600 described above indicate certain events occurring in certain order, those of ordinary skill in the art having the benefit of this disclosure would recognize that the ordering may be different in different embodiments. Additionally, parts of the methods may be performed concurrently in a parallel process when possible, or sequentially. In addition, more parts or less part of the method 600 may be performed.

Figure 7:
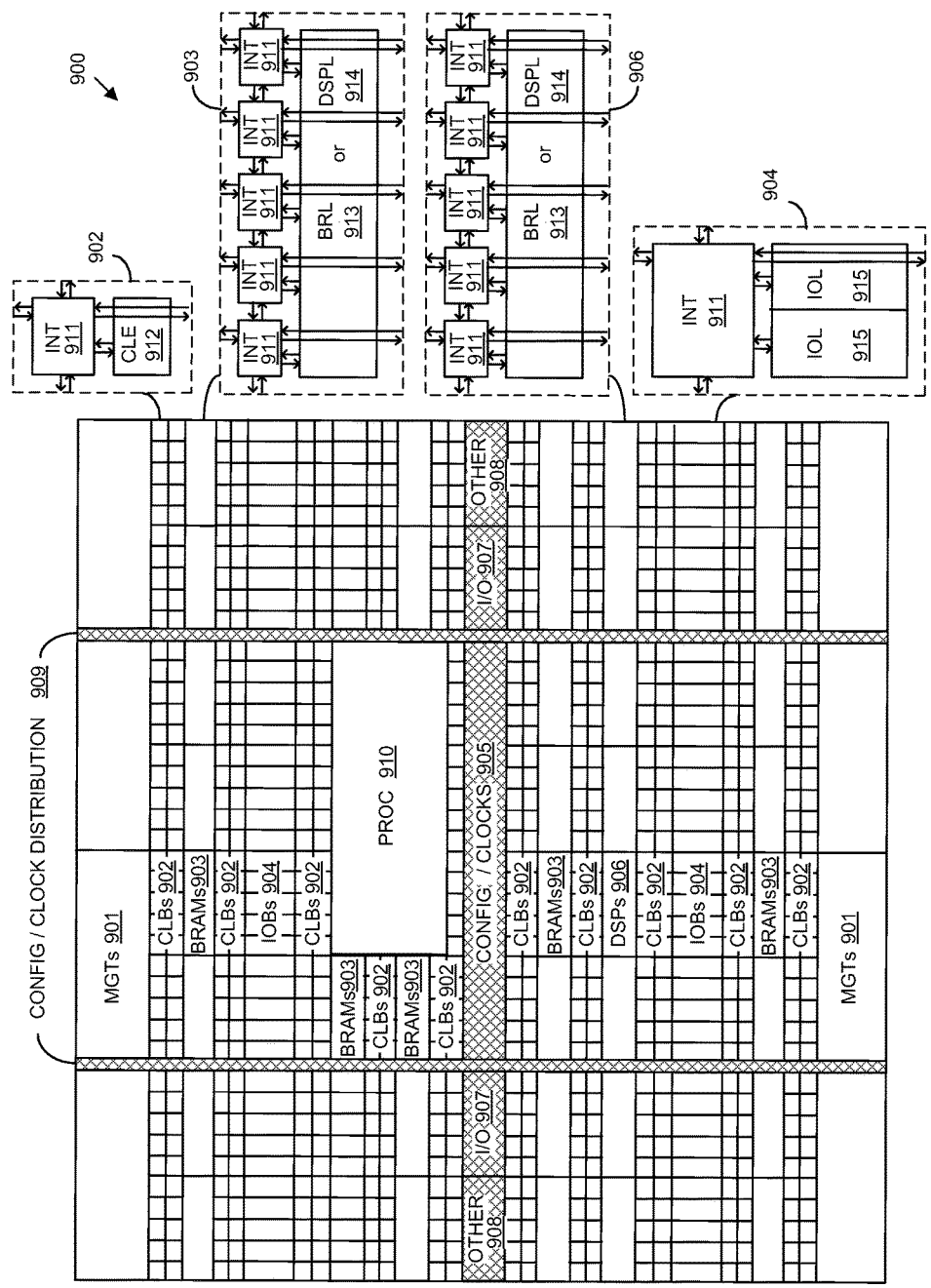
FIG. 7 is a block diagram illustrating an exemplary architecture of an integrated circuit.

FIG. 7 is a block diagram illustrating an exemplary architecture 900 for an IC, which may implement/embody the apparatus 100 or any component thereof. In one aspect, architecture 900 is implemented within a field programmable gate array (FPGA) type of IC. As shown, architecture 900 includes several different types of programmable circuit, e.g., logic, blocks. For example, architecture 900 can include a large number of different programmable tiles including multi-gigabit transceivers (MGTs) 901, configurable logic blocks (CLBs) 902, random access memory blocks (BRAMs) 903, input/output blocks (IOBs) 904, configuration and clocking logic (CONFIG/CLOCKS) 905, digital signal processing blocks (DSPs) 906, specialized I/O blocks 907 (e.g., configuration ports and clock ports), and other programmable logic 908 such as digital clock managers, analog-to-digital converters, system monitoring logic, and so forth.

In some ICs, each programmable tile includes a programmable interconnect element (INT) 911 having standardized connections to and from a corresponding INT 911 in each adjacent tile. Therefore, INTs 911, taken together, implement the programmable interconnect structure for the illustrated IC. Each INT 911 also includes the connections to and from the programmable logic element within the same tile, as shown by the examples included at the top of FIG. 7.

For example, a CLB 902 can include a configurable logic element (CLE) 912 that can be programmed to implement user logic plus a single INT 911. A BRAM 903 can include a BRAM logic element (BRL) 913 in addition to one or more INTs 911. Typically, the number of INTs 911 included in a tile depends on the height of the tile. As pictured, a BRAM tile has the same height as five CLBs, but other numbers (e.g., four) also can be used. A DSP tile 906 can include a DSP logic element (DSPL) 914 in addition to an appropriate number of INTs 911. An 10B 904 can include, for example, two instances of an I/O logic element (IOL) 915 in addition to one instance of an INT 911. As will be clear to those of skill in the art, the actual I/O pads connected, for example, to IOL 915 typically are not confined to the area of IOL 915.

In the example pictured in FIG. 7, a columnar area near the center of the die, e.g., formed of regions 905, 907, and 908, can be used for configuration, clock, and other control logic. Horizontal areas 909 extending from this column are used to distribute the clocks and configuration signals across the breadth of the programmable IC.

Some ICs utilizing the architecture illustrated in FIG. 7 include additional logic blocks that disrupt the regular columnar structure making up a large part of the IC. The additional logic blocks can be programmable blocks and/or dedicated circuitry. For example, a processor block depicted as PROC 910 spans several columns of CLBs and BRAMs.

In one aspect, PROC 910 is implemented as a dedicated circuitry, e.g., as a hard-wired processor, that is fabricated as part of the die that implements the programmable circuitry of the IC. PROC 910 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 910 is omitted from architecture 900 and replaced with one or more of the other varieties of the programmable blocks described. Further, such blocks can be utilized to form a "soft processor" in that the various blocks of programmable circuitry can be used to form a processor that can execute program code as is the case with PROC 910.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 7 that are external to PROC 910 such as CLBs 903 and BRAMs 903 can be considered programmable circuitry of the IC.

In general, the functionality and connectivity of programmable circuitry are not established until configuration data is loaded into the IC. A set of configuration bits can be used to program programmable circuitry of an IC such as an FPGA. The configuration bit(s) typically is referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 910.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 7 is intended to illustrate an exemplary architecture that can be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 7 are purely exemplary. In an actual IC, for example, more than one adjacent column of CLBs is typically included wherever the CLBs appear, to facilitate the efficient implementation of a user circuit design. The number of adjacent CLB columns, however, can vary with the overall size of the IC. Further, the size and/or positioning of blocks such as PROC 910 within the IC are for purposes of illustration only and are not intended as a limitation.

In other cases, the various features described herein may be implemented in any integrated circuit, such as a general purpose processor, a microprocessor, an ASIC, or any other types of processors, which may or may not be a FPGA.

Although particular examples have been shown and described, it will be understood that it is not intended to limit the claimed inventions to the preferred examples, and it will be obvious to those skilled in the art that various changes and modifications may be made without exceeding the scope of the claimed invention. The specification and drawings are, accordingly, to be regarded in an illustrative rather than restrictive sense. The claimed inventions are intended to cover alternatives, modifications, and equivalents.

What is claimed is:

1. A receiver, comprising:
    an automatic gain controller (AGC) configured to receive an analog signal;
    an analog-to-digital converter (ADC) configured to receive an output from the AGC and to output a digitized signal, wherein a most significant bit of the digitized signal corresponds to a sliced data, and a least significant bit of the digitized signal corresponds to an error signal; and
    an adaptation unit configured to provide a Vref signal to control a reference voltage of the ADC, and increase or reduce the reference voltage of the ADC, based at least in part on the digitized signal to achieve a desired data digitization and data slicing, wherein the adaptation unit is configured to reduce the Vref signal if a recovered data associated with a ADC code is at a maximum value and an AGC vote is increasing, and wherein the adaptation unit is configured to increase the Vref signal if the recovered data associated with the ADC code is at a minimum value and the AGC vote is decreasing.

2. The receiver according to claim 1, wherein the ADC is configured to perform an analog-to-digital conversion function and a slicer function.

3. The receiver according to claim 1, wherein the digitized signal comprises information corresponding to a mapping function.

4. The receiver according to claim 1, wherein an operation between the ADC and the adaptation unit does not require a digital signal processor (DSP).

5. The receiver according to claim 1, wherein the ADC comprises an adaptation logic table.

6. The receiver according to claim 1, wherein the adaptation unit comprises a AGC adaptation table configured to provide values for determining an AGC control signal to control the AGC.

7. The receiver according to claim 1, further comprising a continuous time linear equalizer (CTLE) configured to provide the analog signal, wherein the adaptation unit comprises a CTLE adaptation table configured to provide values for determining a CTLE control signal to control the CTLE.

8. The receiver according to claim 1, further comprising a continuous time linear equalizer (CTLE) configured to provide the analog signal, wherein the adaptation unit is configured to adjust a parameter of the CTLE based at least in part on the error signal.

9. The receiver according to claim 1, wherein the adaptation unit is configured for adjusting a parameter of the AGC based at least in part on the error signal.

10. The receiver according to claim 1, wherein the input signal is a PAM-N signal, the ADC comprises a X-bit ADC, and wherein X is equal to log 2(2*N).

11. The receiver according to claim 1, wherein the input signal is a PAM-2 signal or a PAM-4 signal.

12. The receiver according to claim 1, wherein the receiver is a part of, or is configured to operate with, a short-reach system.

13. The receiver according to claim 1, further comprising a continuous time linear equalizer (CTLE) configured to provide the analog signal.

14. A receiver, comprising:
    an automatic gain controller (AGC) configured to receive an analog signal;
    an analog-to-digital converter (ADC) configured to receive an output from the AGC and to output a digitized signal, wherein a most significant bit of the digitized signal corresponds to a sliced data, and a least significant bit of the digitized signal corresponds to an error signal;

an adaptation unit configured to control the AGC, the ADC, or both the AGC and the ADC, based at least in part on the digitized signal to achieve a desired data digitization and data slicing; and a digital signal processor (DSP) coupled to the ADC, wherein the DSP is configured to be switched on when the receiver is performing processing for long reach application, and is configured to be switched off when the receiver is performing processing for short reach application.

15. A method performed by a receiver, comprising:

providing an output by an automatic gain controller (AGC) based on an analog signal;

providing a digitized signal by an analog-to-digital converter (ADC) based on the output from the AGC, wherein a most significant bit of the digitized signal corresponds to a sliced data and a least significant bit of the digitized signal corresponds to an error signal; and providing a Vref signal for controlling a reference voltage of the ADC, and increasing or reducing the reference voltage of the ADC, based at least in part on the digitized signal to achieve a desired data digitization and data slicing, wherein the act of controlling is performed by an adaptation unit;

wherein the act of providing the Vref signal comprises reducing the Vref signal if a recovered data associated with a ADC code is at a maximum value and an AGC vote is increasing, or increasing the Vref signal if the recovered data associated with the ADC code is at a minimum value and the AGC vote is decreasing.

16. The method according to claim 15, further comprising performing a slicer function by the ADC.

17. The method according to claim 15, wherein the analog signal is provided by a continuous time linear equalizer (CTLE), and wherein the method further comprises:

using an AGC adaptation table to determine an AGC control signal to control the AGC; and/or using a CTLE adaptation table to determine a CTLE control signal to control the CTLE.

18. The method according to claim 15, wherein the digitized signal comprises information corresponding to a mapping function.

* * * * *